(12) United States Patent
Khlat et al.

(10) Patent No.: US 11,268,990 B2
(45) Date of Patent: Mar. 8, 2022

(54) CURRENT MEASUREMENT CIRCUIT FOR OPTIMIZATION OF POWER CONSUMPTION IN ELECTRONIC DEVICES

(71) Applicant: Qorvo US, Inc., Greensboro, NC (US)

(72) Inventors: Nadim Khlat, Cugnaux (FR); Philippe Gorisse, Brax (FR); Christopher Truong Ngo, Queen Creek, AZ (US)

(73) Assignee: QORVO US, INC., Greensboro, NC (US)

( * ) Notice: Subject to any disclaimer, the term of this patent is extended or adjusted under 35 U.S.C. 154(b) by 110 days.

(21) Appl. No.: 16/446,863

(22) Filed: Jun. 20, 2019

(65) Prior Publication Data

US 2020/0200805 A1 Jun. 25, 2020

Related U.S. Application Data

(60) Provisional application No. 62/782,908, filed on Dec. 20, 2018.

(51) Int. Cl.
*G01R 19/25* (2006.01)
*G01R 19/165* (2006.01)
*H02J 7/34* (2006.01)
*G06F 1/3212* (2019.01)

(52) U.S. Cl.
CPC ... *G01R 19/2506* (2013.01); *G01R 19/16576* (2013.01); *G06F 1/3212* (2013.01); *H02J 7/345* (2013.01)

(58) Field of Classification Search
CPC .......... G01R 19/2506; G01R 19/16576; G06F 1/3212; H02J 7/345
See application file for complete search history.

(56) References Cited

U.S. PATENT DOCUMENTS 5,099,209 A * 3/1992 Seki ................. G01R 19/16542
324/428
5,841,284 A * 11/1998 Takahashi .......... G01R 31/3648
324/428
5,870,411 A * 2/1999 Durham ......... G01R 31/318544
326/93

(Continued)

*Primary Examiner* — Tung X Nguyen
*Assistant Examiner* — Feba Pothen
(74) *Attorney, Agent, or Firm* — Withrow & Terranova, P.L.L.C.

(57) ABSTRACT

An electrical current measurement circuit is provided. The electrical current measurement circuit is configured to receive a sense current proportionally related to an electrical current of interest to continuously charge a capacitor to a sense voltage. The electrical current measurement circuit is configured to determine whether the sense voltage reaches a predefined voltage threshold and reduce the sense voltage to below the predefined voltage threshold in response to the sense voltage reaching the predefined voltage threshold. The electrical current measurement circuit counts each occurrence of the sense voltage reaching the predefined voltage threshold and quantifies the electrical current based on a total count of the sense voltage reaching the predefined voltage threshold during the predefined measurement period. By incorporating the electrical current measurement circuit in an electronic device, it may be possible to accurately monitor and thus help to optimize power consumption and battery life of the electronic device.

20 Claims, 7 Drawing Sheets

(56) References Cited

U.S. PATENT DOCUMENTS

| | | | | |
|---|---|---|---|---|
| 6,157,170 A * | 12/2000 | Noda | ............... | G01R 31/3828 |
| | | | | 320/132 |
| 7,183,747 B2 * | 2/2007 | Kleineberg | ............ | G01R 31/36 |
| | | | | 320/132 |
| 8,355,467 B2 * | 1/2013 | Ronte | .................... | G01R 23/16 |
| | | | | 375/316 |
| 2008/0303507 A1 * | 12/2008 | Edwards | .............. | G01R 19/255 |
| | | | | 324/76.11 |
| 2014/0181560 A1 * | 6/2014 | Muralidhar | ........... | G06F 1/3287 |
| | | | | 713/323 |
| 2016/0370411 A1 * | 12/2016 | Bruwer | .................... | G01D 5/24 |
| 2018/0123578 A1 * | 5/2018 | Chauhan | ............ | H03K 17/0822 |

\* cited by examiner

CURRENT MEASUREMENT CIRCUIT FOR OPTIMIZATION OF POWER CONSUMPTION IN ELECTRONIC DEVICES

RELATED APPLICATIONS

This application claims the benefit of U.S. provisional patent application Ser. No. 62/782,908, filed on Dec. 20, 2018, the disclosure of which is hereby incorporated herein by reference in its entirety.

FIELD OF THE DISCLOSURE

The technology of the disclosure relates generally to measuring electrical current in an electronic apparatus.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new radio (5G-NR). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Notably, a mobile communication device is typically powered by a battery with a finite capacity. In this regard, power consumption and battery life of the mobile communication device may have a direct impact on overall user experience. As such, it may be desired to obtain an accurate current drain measurement in the mobile communication device to help optimize power consumption and battery life of the mobile communication device.

SUMMARY

Embodiments of the disclosure relate to an electrical current measurement circuit. The electrical current measurement circuit is configured to receive a sense current proportionally related to an electrical current of interest. A capacitor in the electrical current measurement circuit is continuously charged by the sense current to generate a sense voltage. Thus, it is possible to quantify the electrical current based on a change in the sense voltage over a predefined measurement period. In examples discussed herein, the electrical current measurement circuit is configured to determine whether the sense voltage reaches a predefined voltage threshold and reduce the sense voltage to below the predefined voltage threshold in response to the sense voltage reaching the predefined voltage threshold. As a result, the sense voltage varies in a zig-zag fashion in the predefined measurement period. The electrical current measurement circuit is configured to count each occurrence of the sense voltage reaching the predefined voltage threshold and quantify the electrical current based on a total count of the sense voltage reaching the predefined voltage threshold during the predefined measurement period. By incorporating the electrical current measurement circuit in an electronic device, it may be possible to accurately monitor and thus help to optimize power consumption and battery life of the electronic device.

In one aspect, an electrical current measurement circuit is provided. The electrical current measurement circuit includes a sense current input configured to receive a sense current proportionally related to an electrical current to be measured. The electrical current measurement circuit also includes a clock input configured to receive a clock signal including a number of clock cycles. The electrical current measurement circuit also includes a capacitor coupled to the sense current input and configured to generate a sense voltage corresponding to the sense current. The electrical current measurement circuit also includes a determination circuit coupled to the capacitor. The determination circuit is configured to determine whether the sense voltage reaches a predefined voltage threshold. The determination circuit is also configured to count each occurrence of the sense voltage reaching the predefined voltage threshold within a predefined measurement period corresponding to a defined number of the clock cycles. The determination circuit is also configured to reduce the sense voltage to below the predefined voltage threshold upon each occurrence of the sense voltage reaching the predefined voltage threshold. The determination circuit is also configured to quantify the electrical current based on a total count of occurrences of the sense voltage reaching the predefined voltage threshold within the predefined measurement period.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4:
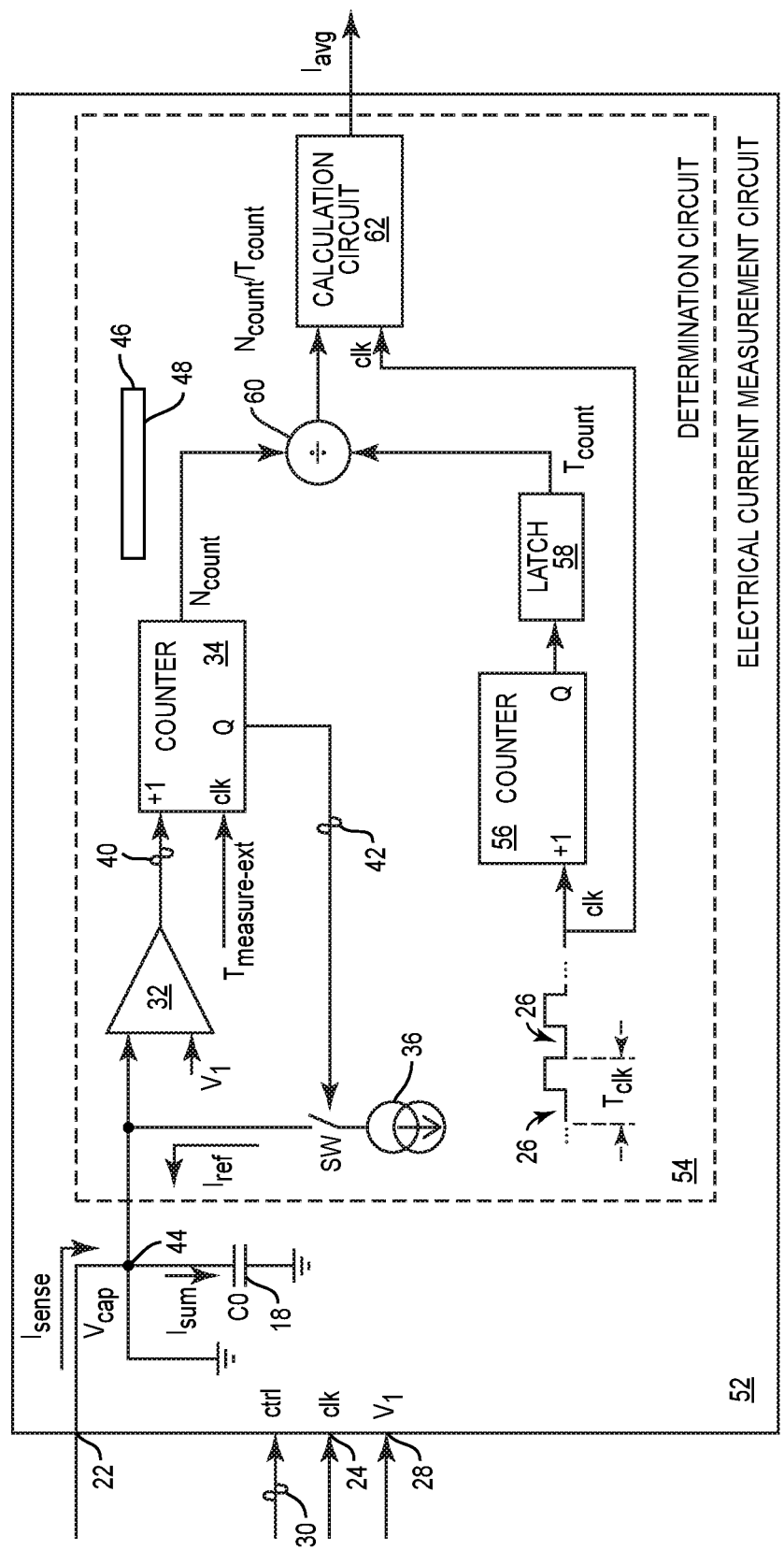
FIG. 4 is a schematic diagram of an exemplary electrical current measurement circuit configured to measure an average of the electrical current in FIG. 2 over an extended measurement period longer than the predefined measurement period.
Figure 6:
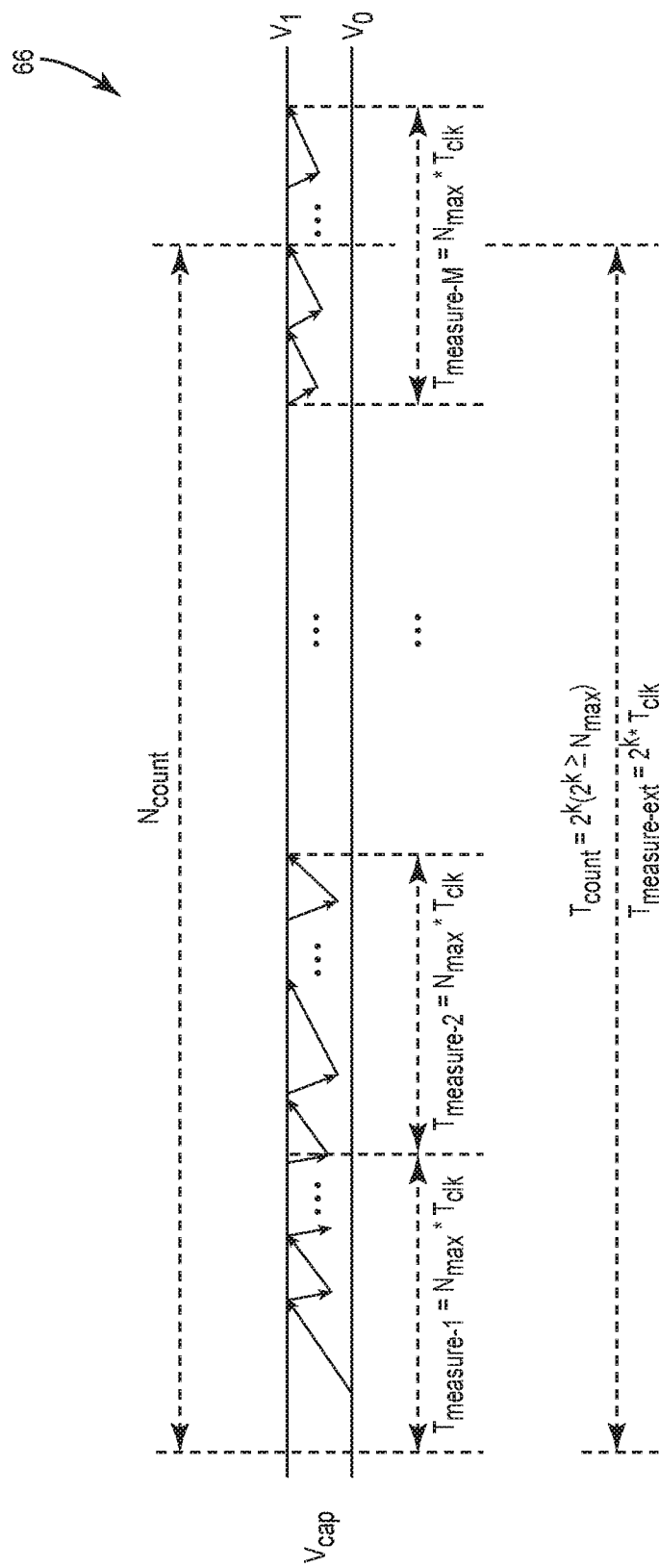
Figure 7:
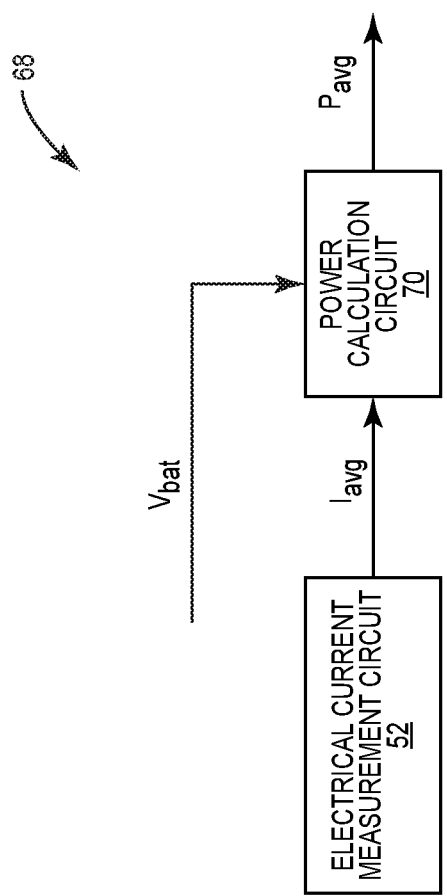

FIG. 6 is a graphic diagram providing an exemplary graphical illustration of the electrical current measurement circuit of FIG. 4 configured according to another embodiment of the present disclosure to quantify the electrical current within the extended predefined measurement period; and FIG. 7 is a schematic diagram of an exemplary power measurement circuit incorporating the electrical current measurement circuit of FIG. 4.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an electrical current measurement circuit. The electrical current measurement circuit is configured to receive a sense current proportionally related to an electrical current of interest. A capacitor in the electrical current measurement circuit is continuously charged by the sense current to generate a sense voltage. Thus, it is possible to quantify the electrical current based on a change in the sense voltage over a predefined measurement period. In examples discussed herein, the electrical current measurement circuit is configured to determine whether the sense voltage reaches a predefined voltage threshold and reduce the sense voltage to below the predefined voltage threshold in response to the sense voltage reaching the predefined voltage threshold. As a result, the sense voltage varies in a zig-zag fashion in the predefined measurement period. The electrical current measurement circuit is configured to count each occurrence of the sense voltage reaching the predefined voltage threshold and quantify the electrical current based on a total count of the sense voltage reaching the predefined voltage threshold during the predefined measurement period. By incorporating the electrical current measurement circuit in an electronic device, it may be possible to accurately monitor and thus help to optimize power consumption and battery life of the electronic device.

Figure 1:
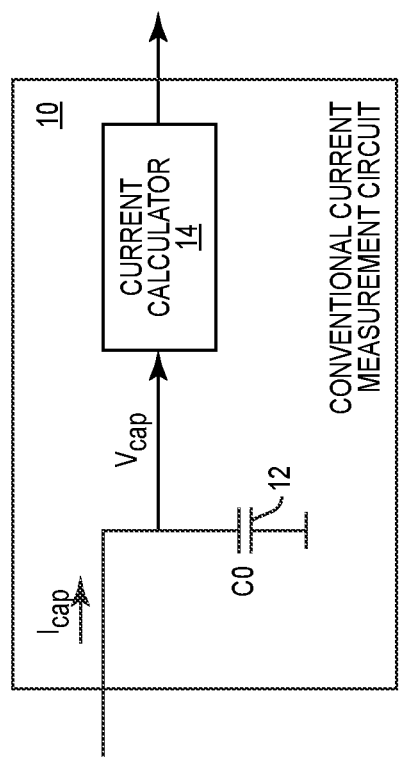
FIG. 1 is a schematic diagram of a conventional electrical current measurement circuit configured to measure an electrical current.

Before discussing an electrical current measurement circuit of the present disclosure, a brief overview of a conventional electrical current measurement circuit is first provided with reference to FIG. 1 to help understand a conventional electrical current measurement mechanism and issues related to the conventional electrical current measurement mechanism. The discussion of specific exemplary aspects of an electrical current measurement circuit of the present disclosure starts below with reference to FIG. 2.

In this regard, FIG. 1 is a schematic diagram of a conventional electrical current measurement circuit 10 configured to measure an electrical current $I_{cap}$. The conventional electrical current measurement circuit 10 includes a capacitor 12, which as a capacitance C0, configured to be continuously charged by the electrical current $I_{cap}$ to generate a voltage $V_{cap}$. A relationship between the electrical current $I_{cap}$, the capacitance C0, and the voltage $V_{cap}$ is well-known and can be expressed in equation (Eq. 1) below.

$$I_{cap} = C0 * (\Delta V_{cap} / \Delta t) \tag{Eq. 1}$$

As shown in the equation (Eq. 1) above, it is possible to quantify the electrical current $I_{cap}$ by measuring a variation of the voltage $V_{cap}$ ($\Delta V_{cap}$) over a period of time ($\Delta t$). Accordingly, the conventional electrical current measurement circuit 10 can include a current calculator 14 to quantify the electrical current $I_{cap}$ based on the equation (Eq. 1) above.

When the conventional electrical current measurement circuit 10 used to measure the electrical current $I_{cap}$ in an electronic device (e.g., a smartphone), the capacitor 12 needs to be small (e.g., C0=50 pF) due to space constraint of the electronic device. As such, the voltage variation $\Delta V_{cap}$ can be fairly large in the period of time ($\Delta t$). For example, if the period of time ($\Delta t$) is 128 μs and the electrical current $I_{cap}$ is 0.08 mA, then the voltage variation $\Delta V_{cap}$ can be as high as 205 V, which may cause potential damage to the electronic device. As such, it may be desired to create a new electrical current measurement mechanism to accurately measure the electrical current $I_{cap}$ in the electronic device without causing damage to the electronic device.

Figure 2:
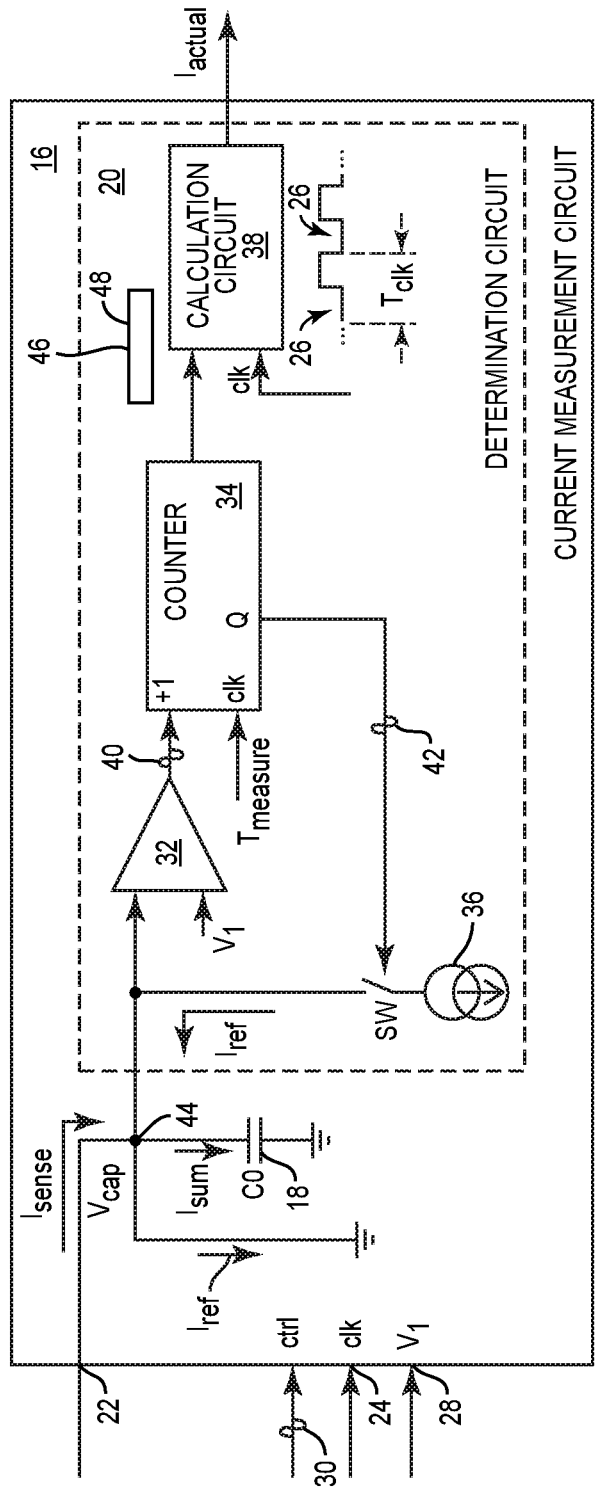
FIG. 2 is a schematic diagram of an electrical current measurement circuit configured according to an embodiment of the present disclosure to measure an electrical current in a predefined measurement period.

In this regard, FIG. 2 is a schematic diagram of an electrical current measurement circuit 16 configured according to an embodiment of the present disclosure to measure an electrical current $I_{actual}$ in a predefined measurement period $T_{measure}$. As opposed to directly measuring the electrical current $I_{actual}$, the electrical current measurement circuit 16 is configured to instead measure a sense current $I_{sense}$ that is proportionally related to the electrical current $I_{actual}$ as shown in equation (Eq. 2) below.

$$I_{sense}=I_{actual}/C_{ratio} \quad \text{(Eq. 2)}$$

In the equation (Eq. 2) above, $C_{ratio}$ ($C_{ratio}>1$) represents a ratio between the electrical current $I_{actual}$ and the sense current $I_{sense}$. By measuring a smaller sense current $I_{sense}$, it may be possible to build the electrical current measurement circuit 16 with fewer and/or smaller components (e.g., transistors), thus helping to reduce footprint of the electrical current measurement circuit 16.

The electrical current measurement circuit 16 includes a capacitor 18 having a capacitance C0. The sense current $I_{sense}$ continuously charges the capacitor 18 to generate a sense voltage $V_{cap}$. Thus, a determination circuit 20 can be coupled to the capacitor 18 in the electrical current measurement circuit 16 to measure the sense voltage $V_{cap}$ and quantify the sense current $I_{sense}$ in accordance to equation (Eq. 1), and further quantify the electrical current $I_{actual}$ based on equation (Eq. 2).

In contrast to the conventional electrical current measurement circuit 10 of FIG. 1, in which the voltage $V_{cap}$ across the capacitor 12 can reach an unsustainable level, the electrical current measurement circuit 16 is configured to accurately measure the sense current $I_{sense}$ while capping the sense voltage $V_{cap}$ across the capacitor 18 at a predefined level based on a predefined voltage threshold $V_1$. In this regard, the electrical current measurement circuit 16 is advantageous over the conventional electrical current measurement circuit 10 in terms of practicality, reliability, and durability.

The electrical current measurement circuit 16 may include a sense current input 22 configured to receive the sense current $I_{sense}$ and a clock input 24 configured to receive a clock signal Clk, which corresponds to a number of clock cycles 26. Each of the clock cycles 26 has a respective clock duration $T_{clk}$. The electrical current measurement circuit 16 may also include a voltage input 28 configured to receive the predefined voltage threshold $V_1$. The electrical current measurement circuit 16 may also receive a control signal 30 configured to control the electrical current measurement circuit 16 to start/stop measuring the sense current $I_{sense}$.

The determination circuit 20 is coupled to the capacitor 18. The determination circuit 20 is configured to quantify the sense current $I_{sense}$ by measuring the sense voltage $V_{cap}$ over the predefined measurement period $T_{measure}$. The predefined measurement period $T_{measure}$ can be configured to include a defined number of the clock cycles 26. For example, the respective clock duration $T_{clk}$ of the clock signal Clk can be 0.5 μs and the predefined measurement period $T_{measure}$ can be configured (e.g., via the control signal 30) to include 256 clock cycles. Accordingly, the predefined measurement period $T_{measure}$ will be 128 μs (256*0.5 μs) in duration. Thus, the determination circuit 20 may be configured to accurately determine the predefined measurement period $T_{measure}$ based on the clock signal Clk.

In a non-limiting example, the determination circuit 20 includes a voltage comparator 32, a counter 34, a reference current generator 36, and a calculation circuit 38. The voltage comparator 32 may be coupled directly to the capacitor 18 and the reference current generator 36 may be coupled to the capacitor 18 via a switch SW. The counter 34 may be coupled to the voltage comparator 32 and the clock input 24. The calculation circuit 38 may be coupled to the counter 34 and the clock input 24.

The voltage comparator 32 is configured to compare the sense voltage $V_{cap}$ against the predefined voltage threshold $V_1$ within the predefined measurement period $T_{measure}$. Each time the sense voltage $V_{cap}$ reaches the predefined voltage threshold $V_1$ (e.g., $V_{cap} \geq V_1$), the voltage comparator 32 generates an indication signal 40 to cause the counter 34 to increment by one (1). The indication signal 40 may also cause the counter 34 to generate a signal 42 to close the switch SW, either concurrent to or subsequent to incrementing the counter 34 by 1, to couple the reference current generator 36 to the capacitor 18. Accordingly, the reference current generator 36 may generate a reference current $I_{ref}$ that flows in an opposite direction relative to the sense current $I_{sense}$. In this regard, the reference current $I_{ref}$ may be combined with the sense current $I_{sense}$ at an input end 44 of the capacitor 18 to generate a combined current $I_{sum}$ ($I_{sum}=I_{sense}-I_{ref}$). In a non-limiting example, the reference current $I_{ref}$ is equal to the sense current $I_{sense}$. As a result, the combined current $I_{sum}$ may become zero to cause the sense voltage $V_{cap}$ to be reduced to below the predefined voltage threshold $V_1$.

In a non-limiting example, the counter 34 can be configured to open the switch SW after the respective clock duration $T_{clk}$, thus removing the reference current $I_{ref}$. As such, the capacitor 18 is once again charged by the sense current $I_{sense}$ to cause the sense voltage $V_{cap}$ to increase toward the predefined voltage threshold $V_1$. In this regard, during the predefined measurement period $T_{measure}$, the sense voltage increases and decreases repeatedly in a zig-zag fashion. At the end of the predefined measurement period $T_{measure}$, the counter 34 may have recorded each occurrence of the sense voltage $V_{cap}$ reaching the predefined voltage threshold $V_1$ to generate a total count of the sense voltage $V_{cap}$ reaching the predefined voltage threshold $V_1$ (hereinafter referred to as "total count $N_{count}$" for brevity). In a non-limiting example, the counter 34 may generate a binary word 46 to digitally quantify the total count $N_{count}$ and store the binary word 46 in a register 48.

In a non-limiting example, the binary word 46 can have a defined number of bits L. Accordingly, the binary word 46 can also be referred to as an L-bit binary word. In this regard, a maximum value of the total count $N_{count}$ (hereinafter referred to as "$N_{max}$" for brevity) that can be stored in the binary word 46 without causing the binary word 46 to overflow is $2^L$. For example, if the binary word is an 8-bit binary word (L=8), then the $N_{max}$ the binary word 46 can store without causing overflow will be 256 ($2^8$).

Given that $N_{max}$ corresponds to the maximum value of the total count $N_{count}$, $N_{max}$ also corresponds to a full-scale (maximum level) of the electrical current $I_{actual}$ (hereinafter referred to as "MAX($I_{actual}$)"). Accordingly, it is possible to divide the full-scale of the electrical current $I_{actual}$ into a number of bitwise units $I_{unit}$ based on equation (Eq. 3) below.

$$I_{unit} = MAX(I_{actual})/N_{max} = MAX(I_{actual})/2^L \quad \text{(Eq. 3)}$$

In this regard, each of the total count $N_{count}$ in the binary word 46 corresponds to a bitwise unit $I_{unit}$ of the electrical current $I_{actual}$. Therefore, it may be possible to quantify the sense current $I_{sense}$ and the electrical current $I_{actual}$ based on the total count $N_{count}$ and the bitwise unit $I_{unit}$, as shown in equations (Eq. 4.1 and 4.2) below.

$$I_{sense} = N_{count} * I_{unit}/C_{ratio} \quad \text{(Eq. 4.1)}$$

$$I_{actual} = N_{count} * I_{unit} \quad \text{(Eq. 4.2)}$$

In addition, the $N_{max}$ may be used to determine the defined number of the clock cycles 26 in the predefined measurement period $T_{measure}$, which can be expressed in equation (Eq. 5) below. In this regard, once the defined number of bits L in the binary word 46 is determined, the $N_{max}$, the $I_{unit}$, and the $T_{measure}$ are determined as well.

$$T_{measure} = N_{max} * T_{clk} = 2^L * T_{clk} \quad \text{(Eq. 5)}$$

Figure 3:
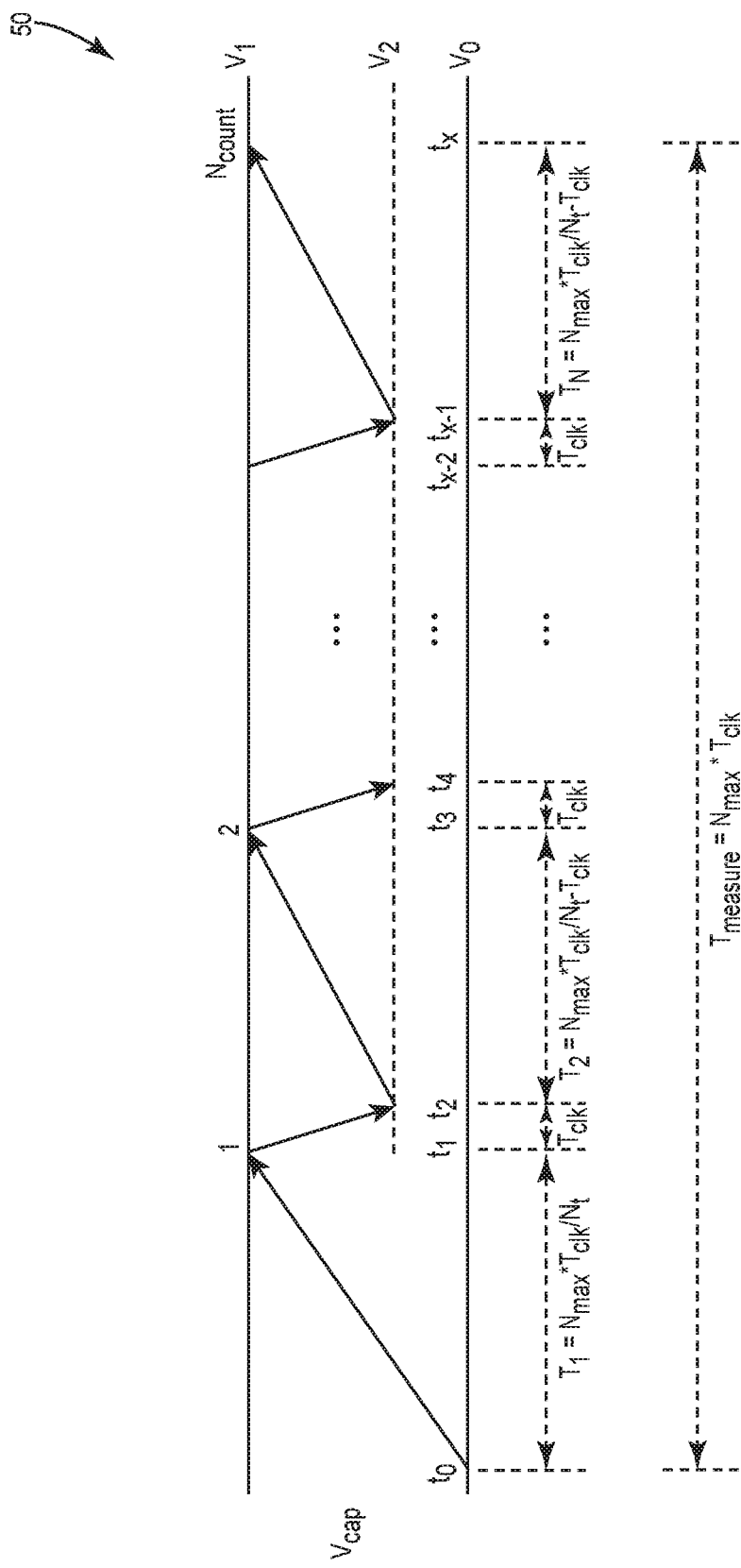
FIG. 3 is a graphic diagram providing an exemplary graphical illustration of the electrical current measurement circuit of FIG. 2 configured to quantify the electrical current.

FIG. 3 is a graphic diagram 50 providing an exemplary graphical illustration of the electrical current measurement circuit 16 of FIG. 2 configured to quantify the electrical current $I_{actual}$ within the predefined measurement period $T_{measure}$. Elements in FIG. 2 are referenced in conjunction with elements in FIG. 3 and will not be re-described herein.

At time $t_0$, which corresponds to a start of the predefined measurement period $T_{measure}$, the sense voltage $V_{cap}$ may be at an initial voltage level $V_0$. At time $t_1$, the capacitor 18 is charged by the sense current $I_{sense}$ to raise the sense voltage $V_{cap}$ to the predefined voltage threshold $V_1$. In a non-limiting example, the predefined voltage threshold $V_1$ can also be determined based on equation (Eq. 6) below.

$$V_1 = V_0 + (N_{max} * I_{unit} * T_{clk})/(C0 * C_{ratio}) \quad \text{(Eq. 6)}$$

As the sense voltage $V_{cap}$ reaches the predefined voltage threshold $V_1$, the counter 34 is triggered to increment the binary word 46 by 1. Concurrently or subsequently, the switch SW is closed to couple the reference current generator 36 to the capacitor 18 to generate the reference current $I_{ref}$. As discussed earlier, the reference current $I_{ref}$ flows in an opposite direction relative to the sense current $I_{sense}$ to offset the sense current $I_{sense}$. In a non-limiting example, the reference current $I_{ref}$ can be determined based on equation (Eq. 7) below.

$$I_{ref} = N_{max} * I_{unit}/C_{ratio} \quad \text{(Eq. 7)}$$

As a result, at time $t_2$, the sense voltage $V_{cap}$ may be reduced from the predefined voltage threshold $V_1$ to an intermediate voltage level $V_2$ ($V_0 < V_2 < V_1$). In a non-limiting example, the duration between time $t_1$ and $t_2$ can equal the respective clock cycle duration $T_{clk}$ of each of the clock cycles 26 and the intermediate voltage level $V_2$ can be determined based on equation (Eq. 8) below.

$$V_2 = V_0 + (N_{count} * I_{unit} * T_{clk})/(C0 * C_{ratio}) \quad \text{(Eq. 8)}$$

Thus, based on equations (Eq. 6 and 8), the difference between the predefined voltage threshold V1 and the intermediate voltage level V2 can be expressed as equation (Eq. 9) below.

$$V_1 - V_2 = (N_{max} - N_{count}) * I_{unit} * T_{clk}/(C0 * C_{ratio}) \quad \text{(Eq. 9)}$$

At time $t_2$, the counter 34 may cause the switch SW to be opened to remove the reference current $I_{ref}$. As a result, the sense voltage $V_{cap}$ starts rising toward the predefined voltage threshold $V_1$ once again. In this regard, the sense voltage $V_{cap}$ is configured to increase and decrease during the predefined measurement period $T_{measure}$ in a zig-zag fashion and the counter 34 is configured to count each occurrence of the sense voltage $V_{cap}$ reaching the predefined voltage threshold $V_1$. At the end of the predefined measurement period (e.g., at time $t_x$), the counter 34 has generated the total count ($N_{count}$) of the sense voltage $V_{cap}$ reaching the predefined voltage threshold $V_1$. Accordingly, the calculation circuit 38 may quantify the sense current $I_{sense}$ and the electrical current $I_{actual}$ based on equations (Eq. 4.1) and (Eq. 4.2), respectively.

The graphic diagram 50 illustrates that the electrical current measurement circuit 16 of FIG. 2 can accurately quantify the electrical current $I_{actual}$ within the predefined measurement period $T_{measure}$. However, in some cases, it may be further desired to quantify an average of the electrical current $I_{actual}$ over an extended measurement period that is longer than the predefined measurement period $T_{measure}$. In this regard, FIG. 4 is a schematic diagram of an exemplary electrical current measurement circuit 52 configured to quantify an average of the electrical current $I_{actual}$ in FIG. 2 (hereinafter referred to as "average current $I_{avg}$" for brevity) over an extended measurement period $T_{measure-ext}$ longer than the predefined measurement period $T_{measure}$. Common elements between FIGS. 2 and 4 are shown therein with common element numbers and will not be re-described herein.

The electrical current measurement circuit 52 includes a determination circuit 54 that includes the voltage comparator 32, the counter 34, and the reference current generator 36. The voltage comparator 32 is configured to compare the sense voltage $V_{cap}$ with the predefined voltage threshold $V_1$ to determine whether the sense voltage $V_{cap}$ reaches the predefined voltage threshold $V_1$. Each time the sense voltage $V_{cap}$ reaches the predefined voltage threshold $V_1$, the counter 34 is incremented by 1. In this regard, at the end of the extended measurement period $T_{measure-ext}$, the counter 34 would have counted each occurrence of the sense voltage $V_{cap}$ reaching the predefined voltage threshold $V_1$ to generate the total count $N_{count}$.

The determination circuit 54 includes a second counter 56 and a latch 58. The determination circuit 54 may also include a divider 60. The second counter 56 is configured to count the clock cycles 26 to generate a total number of the clock cycles 26 occurring during the extended measurement period $T_{measure-ext}$ (hereinafter referred to as "total number $T_{count}$" for brevity). The latch 58 may be configured to latch at the total number $T_{count}$ to cause the divider 60 to divide the total count $N_{count}$ by the total number $T_{count}$ ($N_{count}/T_{count}$). The determination circuit 54 may also include a calculation circuit 62 configured to quantify the average current $I_{avg}$ during the extended measurement period $T_{measure-ext}$ based on the total count $N_{count}$ and the total number $T_{count}$. In a non-limiting example, the average current $I_{avg}$ can be determined based on equation (Eq. 10) below.

$$I_{avg} = (N_{count}/T_{count}) * (N_{max} * I_{unit}/C_{ratio}) \quad \text{(Eq. 10)}$$

Figure 5:
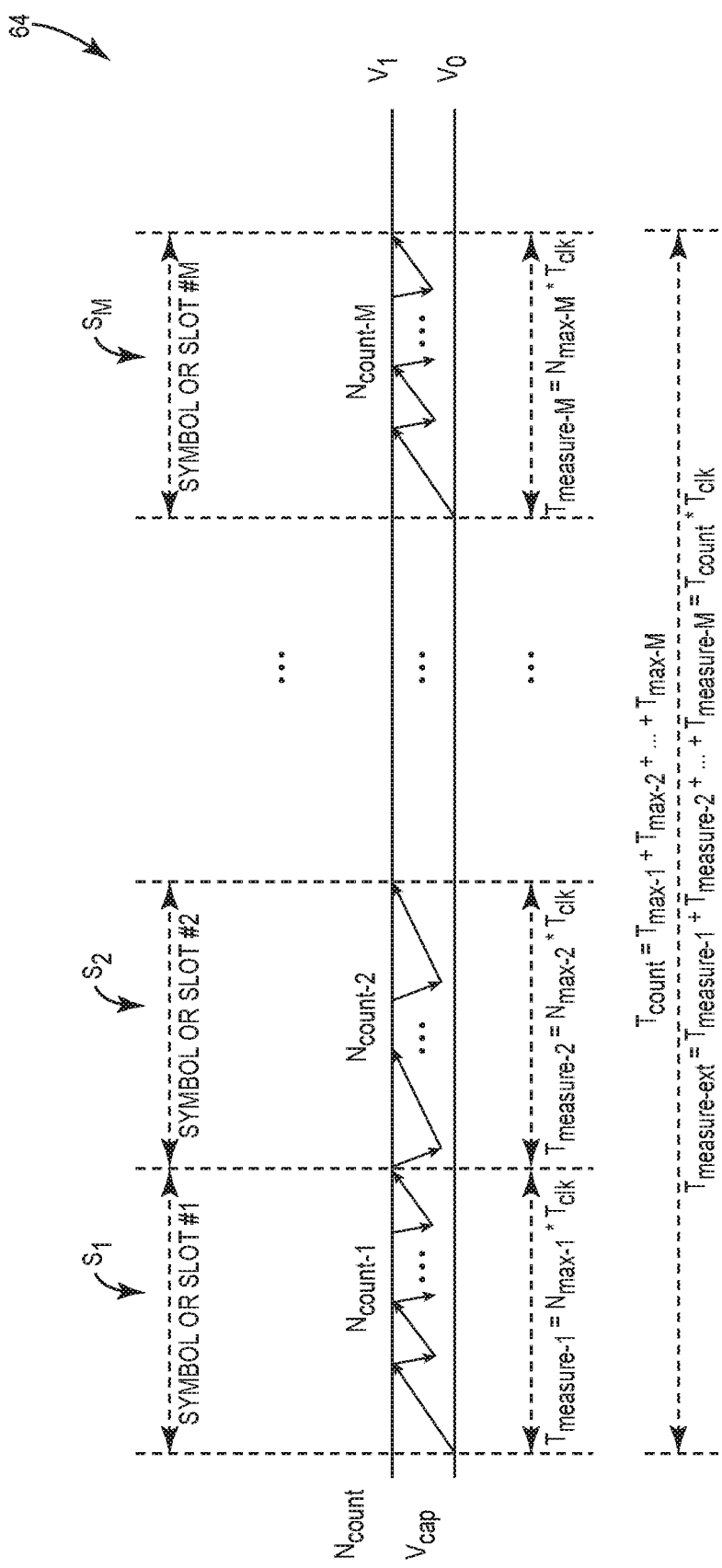
FIG. 5 is a graphic diagram providing an exemplary graphical illustration of the electrical current measurement circuit of FIG. 4 configured according to one embodiment of the present disclosure to quantify the electrical current within the extended predefined measurement period.

FIG. 5 is a graphic diagram 64 providing an exemplary graphical illustration of the electrical current measurement circuit 52 of FIG. 4 configured according to one embodiment of the present disclosure to quantify the electrical current $I_{actual}$ within the extended predefined measurement period $T_{measure-ext}$. Elements in FIG. 4 are referenced in conjunction with elements in FIG. 5 and will not be re-described herein.

In a non-limiting example, the extended measurement period $T_{measure-ext}$ includes an integer number of predefined measurement periods $T_{measure-1}$-$T_{measure-M}$. As discussed above, the extended measurement period $T_{measure-ext}$ is also latched at the total count $T_{count}$. As such, the extended measurement period $T_{measure-ext}$ can be expressed in equation (Eq. 11) below.

$$T_{measure-ext} = \Sigma_{i=1}^{M} T_{measure-i} = T_{count} * T_{clk} \qquad (Eq.\ 11)$$

Each of the predefined measurement periods $T_{measure-1}$-$T_{measure-M}$ has a respective duration $T_{measure-i}$ ($1 \leq i \leq M$) that can be expressed in equation (Eq. 12) below.

$$T_{measure-i} = N_{max-i} * T_{clk} (1 \leq i \leq M) \qquad (Eq.\ 12)$$

In the equation (Eq. 12) above, $N_{max-i}$ is equivalent to the $N_{max}$ as described earlier. Notably, the respective duration $T_{measure-i}$ ($1 \leq i \leq M$) among the predefined measurement periods $T_{measure-1}$-$T_{measure-M}$ can be identical or different. Accordingly, the counter 34 is configured to count each occurrence of the sense voltage reaching the predefined voltage threshold $V_1$ in each of the predefined measurement periods $T_{measure-1}$-$T_{measure-M}$ as described above in FIGS. 2 and 3 to generate a number of total counts $N_{count-1}$-$N_{count-M}$. Given that the sense current $I_{sense}$ can be identical or different in the predefined measurement periods $T_{measure-1}$-$T_{measure-M}$, the total counts $N_{count-1}$-$N_{count-M}$ may be identical or different as well. In this example, the total count $N_{count}$ is a sum of the total counts $N_{count-1}$-$N_{count-M}$ ($N_{count} = \Sigma_{i=1}^{M} N_{count-i}$).

Notably, it may be possible for the sense current $I_{sense}$ to become zero during one or more of the predefined measurement periods $T_{measure-1}$-$T_{measure-M}$ due to inactivity (e.g., OFF) of an apparatus in which the electrical current measurement circuit 52 is provided. In this regard, the electrical current measurement circuit 52 may be configured (e.g., via the control signal 30) to exit the extended measurement period $T_{measure-ext}$ or temporarily suspend the extended measurement period $T_{measure-ext}$ until the sense current $I_{sense}$ becomes available again.

In a non-limiting example, the predefined measurement periods $T_{measure-1}$-$T_{measure-M}$ can be aligned with a number of orthogonal frequency division multiplex (OFDM) symbols/slots $S_1$-$S_M$, respectively. Notably, in such advanced wireless communication systems as fifth-generation new-radio (5G-NR), the electrical current $I_{actual}$ may vary from one OFDM symbol/slot to another. As such, the electrical current measurement circuit 52 may be able to measure the average current $I_{avg}$ across the OFDM symbols/slots $S_1$-$S_M$. It should be appreciated that the electrical current measurement circuit 52 may be able to measure the average current $I_{avg}$ across multiple OFDM symbols/slots based on the total count $N_{count}$, the total number $T_{count}$, and equation (Eq. 10) even if the extended measurement period $T_{measure-ext}$ does not align with respective boundaries of the OFDM symbols/slots.

With reference back to FIG. 4, it may be possible to configure the latch 58 to latch at a selected number of clock cycles $2^k$ ($2^k \geq N_{max}$), as opposed to latching at the total number $T_{count}$. In this regard, FIG. 6 is a graphic diagram 66 providing an exemplary graphical illustration of the electrical current measurement circuit 52 of FIG. 4 configured according to another embodiment of the present disclosure to quantify the electrical current $I_{actual}$ within the extended predefined measurement period $T_{measure-ext}$. Elements in FIG. 4 are referenced in conjunction with elements in FIG. 6 and will not be re-described herein.

As shown in the graphic diagram 66, the extended measurement period $T_{measure-ext}$ ends in the middle of the predefined measurement period $T_{measure-M}$. As such, the extended measurement period $T_{measure-ext}$ includes a non-integer number of predefined measurement periods $T_{measure-1}$-$T_{measure-M}$. The duration of the extended measurement period $T_{measure-ext}$ is thus depending on the selected number of clock cycles $2^k$, as shown below in equation (Eq. 13).

$$T_{measure-ext} = 2^k * T_{clk} \qquad (Eq.\ 13)$$

The counter 34 is configured to count each occurrence of the sense voltage $V_{cap}$ reaching the predefined voltage threshold until the latch 58 latches at the selected number of clock cycles $2^k$. Accordingly, the divider 60 divides the total count $N_{count}$ by the selected number of clock cycles $2^k$ ($N_{count}/2^k$). In a non-limiting example, the divider 60 may divide the total count $N_{count}$ by the selected number of clock cycles $2^k$ simply by right-shifting the total count $N_{count}$ for $k$ bits. As a result, the average current $I_{avg}$ can be determined based on equation (Eq. 14) below.

$$I_{avg} = (N_{count}/2^k) * (N_{max} * I_{unit}/C_{ratio}) \qquad (Eq.\ 14)$$

Notably, the electrical current measurement circuit 16 of FIG. 2 and the electrical current measurement circuit 52 of FIG. 4 may each draw a small amount of electrical current when measuring the electrical current $I_{actual}$. However, the electrical current measurement circuit 16 and the electrical current measurement circuit 52 may not draw any electrical current when not measuring the electrical current $I_{actual}$. Thus, by turning off the electrical current measurement circuit 16 and the electrical current measurement circuit 52 (e.g., via the control signal 30) outside the predefined measurement period $T_{measure}$ and the extended measurement period $T_{measure-ext}$, respectively, it may be possible minimize efficiency degradation in an electronic apparatus in which the electrical current $I_{actual}$ is measured.

The electrical current measurement circuit 52 of FIG. 4 can be provided in a power measurement circuit to measure an average power over the extended measurement period $T_{measure-ext}$. In this regard, FIG. 7 is a schematic diagram of an exemplary power measurement circuit 68 incorporating the electrical current measurement circuit 52 of FIG. 4.

The power measurement circuit 68 includes a power calculation circuit 70. The power calculation circuit 70 is configured to receive the average current $I_{avg}$ that is measured by the electrical current measurement circuit 52 as described above. The power calculation circuit 70 may also receive a voltage input $V_{bat}$. Accordingly, the power calculation circuit 70 may be able to measure an average power $P_{avg}$ based on the average current $I_{avg}$ and the voltage input $V_{bat}$.

Those skilled in the art will recognize improvements and modifications to the preferred embodiments of the present disclosure. All such improvements and modifications are considered within the scope of the concepts disclosed herein and the claims that follow.

What is claimed is:

1. An electrical current measurement circuit comprising:
   a sense current input configured to receive a sense current smaller than an electrical current to be measured;
   a clock input configured to receive a clock signal comprising a plurality of clock cycles;
   a capacitor coupled to the sense current input and configured to generate a sense voltage corresponding to the sense current; and
   a determination circuit coupled to the capacitor and configured to:

determine whether the sense voltage reaches a predefined voltage threshold;

count each occurrence of the sense voltage reaching the predefined voltage threshold within a predefined measurement period corresponding to a defined number of the plurality of clock cycles;

reduce the sense voltage to below the predefined voltage threshold upon each occurrence of the sense voltage reaching the predefined voltage threshold; and quantify the electrical current as a function of a total count of occurrences of the sense voltage reaching the predefined voltage threshold within the predefined measurement period and a ratio between the electrical current and the sense current.

2. The electrical current measurement circuit of claim 1 wherein the determination circuit comprises:

a voltage comparator configured to compare the sense voltage with the predefined voltage threshold to determine whether the sense voltage reaches the predefined voltage threshold;

a counter configured to:
 count each occurrence of the sense voltage reaching the predefined voltage threshold within the predefined measurement period; and
 store the total count of occurrences of the sense voltage reaching the predefined voltage threshold;

a reference current generator configured to generate a reference current flowing in an opposite direction relative to the sense current in response to the sense voltage reaching the predefined voltage threshold; and a calculation circuit configured to quantify the electrical current based on the total count of occurrences of the sense voltage reaching the predefined voltage threshold and the defined number of the plurality of clock cycles.

3. The electrical current measurement circuit of claim 2 wherein the determination circuit is further configured to combine the reference current with the sense current for a clock cycle duration of the clock signal to reduce the sense voltage to below the predefined voltage threshold.

4. The electrical current measurement circuit of claim 2 wherein the counter is further configured to digitally quantify the total count of occurrences of the sense voltage reaching the predefined voltage threshold in a binary word of a defined number of bits and store the binary word in a register.

5. The electrical current measurement circuit of claim 4 wherein the determination circuit is further configured to quantify the electrical current based on an equation expressed as: $I_{actual}=N_{count}*I_{unit}*C_{ratio}$, wherein:

$I_{actual}$ represents the electrical current;

$N_{count}$ represents the total count of occurrences of the sense voltage reaching the predefined voltage threshold within the predefined measurement period;

$I_{unit}$ represents a bitwise unit of the electrical current; and $C_{ratio}$ represents the ratio between the electrical current and the sense current.

6. The electrical current measurement circuit of claim 5 wherein the predefined measurement period is determined based on an equation expressed as: $T_{measure}=N_{max}*T_{clk}$, wherein:

$T_{measure}$ represents the predefined measurement period;

$N_{max}$ equals $2^L$, wherein L represents the defined number of bits of the binary word; and $T_{clk}$ represents a clock cycle duration of the clock signal.

7. The electrical current measurement circuit of claim 6 wherein the predefined voltage threshold is determined based on an equation expressed as: $V_1=V_0+(N_{count}*I_{unit}*T_{clk})/(C0*C_{ratio})$, wherein:

$V_1$ represents the predefined voltage threshold;

$V_0$ represents an initial voltage level of the sense voltage at a start of the predefined measurement period; and C0 represents a capacitance of the capacitor.

8. The electrical current measurement circuit of claim 7 wherein the reference current is determined based on an equation expressed as: $I_{ref}=N_{max}*I_{unit}/C_{ratio}$, wherein $I_{ref}$ represents the reference current.

9. The electrical current measurement circuit of claim 1 wherein the determination circuit is further configured to determine an average of the electrical current over an extended measurement period longer than the predefined measurement period.

10. The electrical current measurement circuit of claim 9 wherein the determination circuit is further configured to:

count each occurrence of the sense voltage reaching the predefined voltage threshold within the extended measurement period;

reduce the sense voltage to below the predefined voltage threshold upon each occurrence of the sense voltage reaching the predefined voltage threshold within the extended measurement period;

count a total number of clock cycles among the plurality of clock cycles occurring within the extended measurement period; and quantify the average of the electrical current based on a total count of occurrences of the sense voltage reaching the predefined voltage threshold within the extended measurement period and the total number of clock cycles occurring within the extended measurement period.

11. The electrical current measurement circuit of claim 10 wherein the determination circuit comprises:

a voltage comparator configured to compare the sense voltage with the predefined voltage threshold to determine whether the sense voltage reaches the predefined voltage threshold;

a counter configured to count each occurrence of the sense voltage reaching the predefined voltage threshold within the extended measurement period;

a reference current generator configured to generate a reference current flowing in an opposite direction relative to the sense current in response to the sense voltage reaching the predefined voltage threshold;

a second counter configured to count the total number of clock cycles among the plurality of clock cycles occurring within the extended measurement period;

a latch configured to latch at the total number of clock cycles occurring within the extended measurement period; and a calculation circuit configured to quantify the average of the electrical current based on the total count of occurrences of the sense voltage reaching the predefined voltage threshold within the extended measurement period and the total number of clock cycles occurring within the extended measurement period.

12. The electrical current measurement circuit of claim 10 wherein the determination circuit is further configured to quantify the average of the electrical current based on an equation expressed as: $I_{avg}=(N_{count}*N_{max}*I_{unit})(T_{count}*C_{ratio})$, wherein:

$I_{avg}$ represents the average of the electrical current;

$N_{count}$ represents the total count of occurrences of the sense voltage reaching the predefined voltage threshold within the extended measurement period;

$N_{max}$ equals $2^L$, wherein L represents a defined number of bits used to digitally quantify the electrical current;

$I_{unit}$ represents a bitwise unit of the electrical current;

$T_{count}$ represents the total number of clock cycles occurring within the extended measurement period; and $C_{ratio}$ represents the ratio between the electrical current and the sense current.

13. The electrical current measurement circuit of claim 9 wherein the determination circuit is further configured to:

count each occurrence of the sense voltage reaching the predefined voltage threshold within the extended measurement period;

reduce the sense voltage to below the predefined voltage threshold upon each occurrence of the sense voltage reaching the predefined voltage threshold within the extended measurement period;

count a selected number of clock cycles among the plurality of clock cycles occurring within the extended measurement period; and quantify the average of the electrical current based on a total count of occurrences of the sense voltage reaching the predefined voltage threshold within the extended measurement period and the selected number of clock cycles occurring within the extended measurement period.

14. The electrical current measurement circuit of claim 13 wherein the determination circuit comprises:

a voltage comparator configured to compare the sense voltage with the predefined voltage threshold to determine whether the sense voltage reaches the predefined voltage threshold;

a counter configured to count each occurrence of the sense voltage reaching the predefined voltage threshold within the extended measurement period;

a reference current generator configured to generate a reference current flowing in an opposite direction relative to the sense current in response to the sense voltage reaching the predefined voltage threshold;

a second counter configured to count a total number of clock cycles among the plurality of clock cycles occurring within the extended measurement period;

a latch configured to latch at the selected number of clock cycles occurring within the extended measurement period; and a calculation circuit configured to quantify the average of the electrical current based on the total count of occurrences of the sense voltage reaching the predefined voltage threshold within the extended measurement period and the selected number of clock cycles occurring within the extended measurement period.

15. The electrical current measurement circuit of claim 13 wherein the determination circuit is further configured to quantify the average of the electrical current based on an equation expressed as: $I_{avg}=(N_{count}*N_{max}*I_{unit})(T_{count}*C_{ratio})$, wherein:

$I_{avg}$ represents the average of the electrical current;

$N_{count}$ represents the total count of occurrences of the sense voltage reaching the predefined voltage threshold within the extended measurement period;

$N_{max}$ equals $2^L$, wherein L represents a defined number of bits used to digitally quantify the electrical current;

$I_{unit}$ represents a bitwise unit of the electrical current;

$T_{count}$ represents the selected number of clock cycles occurring within the extended measurement period; and $C_{ratio}$ represents the ratio between the electrical current and the sense current.

16. The electrical current measurement circuit of claim 15 wherein the selected number of clock cycles is determined based on an equation expressed as: $T_{count}=2^K$, wherein K is greater than or equal to the defined number of bits used to digitally quantify the electrical current ($K \geq L$).

17. The electrical current measurement circuit of claim 9 wherein the extended measurement period comprises an integer number of the predefined measurement period.

18. The electrical current measurement circuit of claim 17 wherein the integer number of the predefined measurement period corresponds to an integer number of orthogonal frequency division multiplex (OFDM) symbols or slots.

19. The electrical current measurement circuit of claim 9 wherein the extended measurement period comprises a non-integer number of the predefined measurement period.

20. The electrical current measurement circuit of claim 9 wherein the determination circuit is further configured to determine an average power corresponding to the average of the electrical current over the extended measurement period.

* * * * *